United States Patent
Diaz et al.

(10) Patent No.: US 9,349,655 B2
(45) Date of Patent: May 24, 2016

(54) METHOD FOR MECHANICAL STRESS ENHANCEMENT IN SEMICONDUCTOR DEVICES

(75) Inventors: Carlos H. Diaz, Mountain View, CA (US); Yi-Ming Sheu, Hsinchu (TW); Anson Wang, Jinhu Township, Kinmen County (TW); Kong-Beng Thei, Pao-Shan Village (TW); Sheng-Chen Chung, Jhubei (TW); Hao-Yi Tsai, Hsinchu (TW); Hsien-Wei Chen, Sinying (TW); Harry Hak-Lay Chuang, Hsin-Chu (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1363 days.

(21) Appl. No.: 12/391,821

(22) Filed: Feb. 24, 2009

(65) Prior Publication Data
US 2010/0052065 A1   Mar. 4, 2010

Related U.S. Application Data

(60) Provisional application No. 61/093,155, filed on Aug. 29, 2008, provisional application No. 61/098,078, filed on Sep. 18, 2008.

(51) Int. Cl.
| | |
|---|---|
| *H01L 21/70* | (2006.01) |
| *H01L 21/8238* | (2006.01) |
| *H01L 27/02* | (2006.01) |
| *H01L 29/165* | (2006.01) |
| *H01L 29/66* | (2006.01) |
| *H01L 29/78* | (2006.01) |

(52) U.S. Cl.
CPC ...... *H01L 21/823807* (2013.01); *H01L 21/823828* (2013.01); *H01L 27/0207* (2013.01); *H01L 29/165* (2013.01); *H01L 29/66628* (2013.01); *H01L 29/7848* (2013.01)

(58) Field of Classification Search
CPC ............... H01L 21/823807; H01L 21/823828; H01L 27/0207; H01L 29/165; H01L 29/66628; H01L 29/7848
USPC ......... 257/202, 204, 206, 368, 401, 499, 506, 257/E29.255, E21.444, E21.409; 438/294, 438/431, 587

See application file for complete search history.

(56) References Cited

U.S. PATENT DOCUMENTS

| | | | |
|---|---|---|---|
| 6,130,139 A | * | 10/2000 | Ukeda ............... H01L 21/76232 257/E21.549 |
| 6,909,189 B2 | | 6/2005 | Nanjo |
| 7,259,393 B2 | | 8/2007 | Chung et al. |
| 2004/0089950 A1 | | 5/2004 | Nanjo |

(Continued)

FOREIGN PATENT DOCUMENTS

| | | |
|---|---|---|
| CN | 1280903 | 10/2006 |
| CN | 1941329 | 4/2007 |
| CN | 101022105 | 8/2007 |

*Primary Examiner* — Meiya Li
(74) *Attorney, Agent, or Firm* — Haynes and Boone, LLP (57) ABSTRACT

The present disclosure provides an integrated circuit. The integrated circuit includes a semiconductor substrate having an active region; at least one operational device on the active region, wherein the operational device include a strained channel; and at least one first dummy gate disposed at a side of the operational device and on the active region.

20 Claims, 6 Drawing Sheets

(56) References Cited

U.S. PATENT DOCUMENTS

| | | | |
|---|---|---|---|
| 2005/0009312 A1* | 1/2005 | Butt et al. | 438/587 |
| 2005/0041477 A1* | 2/2005 | Lee | G11C 16/16 365/185.29 |
| 2006/0038233 A1* | 2/2006 | Otsuki | 257/365 |
| 2007/0020858 A1 | 1/2007 | Yang et al. | |
| 2007/0072376 A1 | 3/2007 | Chen et al. | |
| 2009/0224328 A1* | 9/2009 | Ting et al. | 257/368 |

* cited by examiner

METHOD FOR MECHANICAL STRESS ENHANCEMENT IN SEMICONDUCTOR DEVICES

PRIORITY DATA

This application claims priority to Provisional Application Ser. No. 61/093,155 filed on Aug. 29, 2008, entitled "NOVEL PMOS DESIGN FOR DEVICE OPTIMIZATION," and to Provisional Application Ser. No. 61/098,078 filed on Sep. 18, 2008, entitled "METHOD FOR MECHANICAL STRESS ENHANCEMENT IN SEMICONDUCTOR DEVICES," the entire disclosures of which are hereby incorporated by reference.

BACKGROUND

When a semiconductor device such as a metal-oxide-semiconductor field-effect transistors (MOSFETs) is scaled down through various technology nodes, high k dielectric material and metal are adopted to form a gate stack. In addition, a strained substrate using epitaxy silicon germanium (SiGe) may be used to enhance the carrier mobility. However, there is no strained engineering process correlated to circuit design optimization, especially in the epitaxy SiGe feature. Therefore, the epitaxy SiGe feature at an active region edge may cause mismatch issue and device performance degradation. Additionally, in the current device structure, the active region has a profile with a facet shape at the edge of the active region. The channel stress is decreased and the device performance is degraded thereby.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
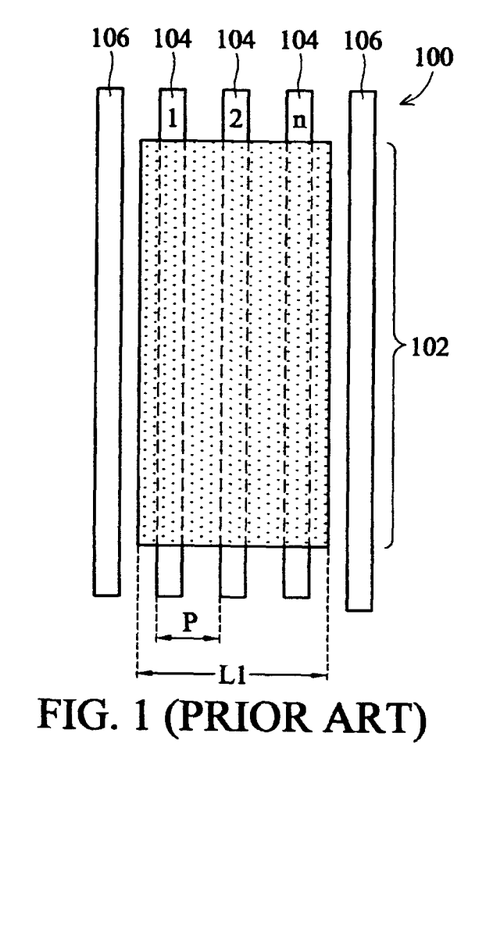
FIG. 1-2 are top views of two examples of a conventional semiconductor structure.
Figure 2:
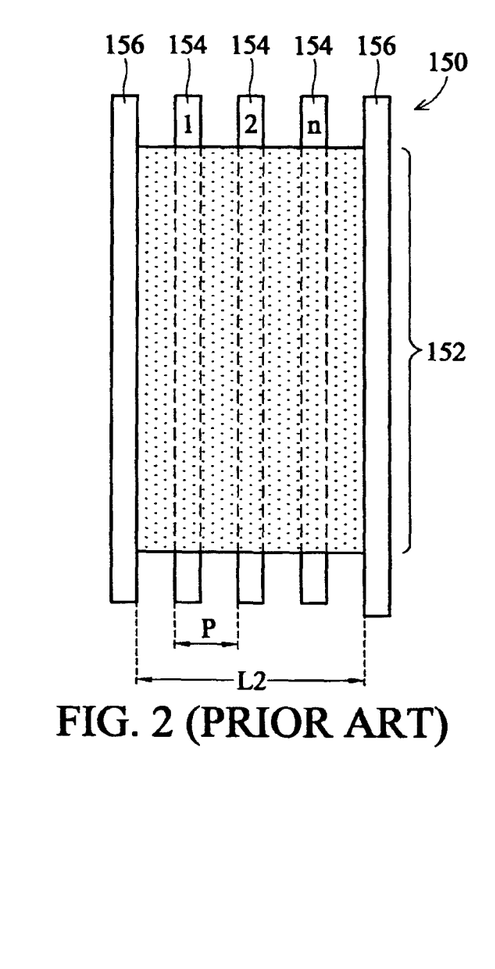

FIGS. 1-2 are top views of two examples of an existing semiconductor structures. In FIG. 1, the semiconductor device 100 includes an active region 102 defined in a semiconductor substrate. The active region is surrounded by isolation regions, such as shallow trench isolation (STI) features. The active region 102 has a length L1 as illustrated in FIG. 1. One or more operational devices 104, such as devices 1, 2, . . . and n, are formed in the active region 102. The gate features of devices 104 may be extended out from the active region for electric connection. Furthermore, one or more dummy gates 106 are disposed in the isolation region, adjacent the active region and configured with the operational device array in a similar pitch "P", as illustrated in FIG. 1. However, this structure suffers non-symmetric source and drain, poor STI-edge leakage & degraded device performance.

In FIG. 2, the semiconductor device 150 includes an active region 152 defined in a semiconductor substrate. The active region 152 is surrounded by isolation regions, such as STI features. The active region 152 has a length L2 as illustrated in FIG. 2. One or more operational devices 154, such as devices 1, 2, . . . and n, are formed in the active region 152. The gate features of devices 154 may be extended out beyond the active region for electric connection. Furthermore, one or more dummy gates 156 are disposed in the isolation region, adjacent the active region and configured with the operational device array 154 in a similar pitch "P", as illustrated in FIG. 2. However, this structure suffers dummy polysilicon peeling, poor polysilicon photo depth of focus (DOF), STI-edge leakage and spacer leakage.

Figure 3:
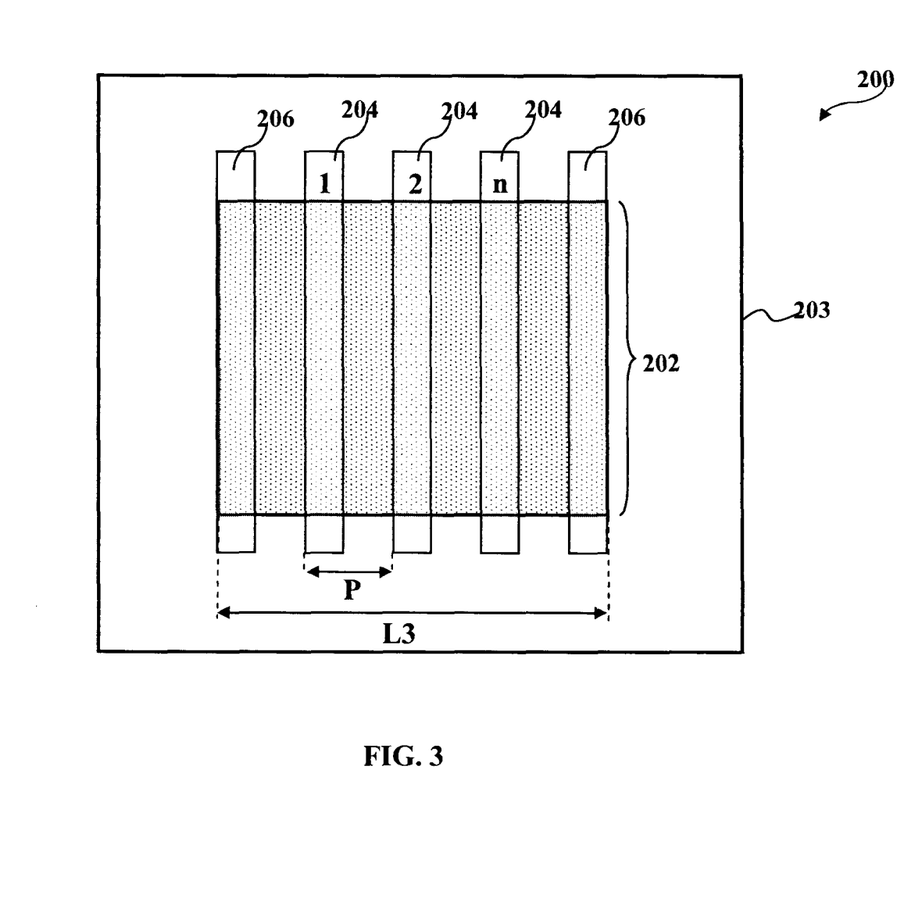
FIG. 3 is a top view of a semiconductor structure constructed according to aspects of the present disclosure in an embodiment.

FIG. 3 is a top view of a semiconductor structure 200 constructed according to aspects of the present disclosure. The semiconductor structure 200 is described below according to one or more embodiments. The semiconductor device 200 includes an active region 202 defined in a semiconductor substrate (not shown). The semiconductor substrate is a silicon substrate. Various shallow trench isolation (STI) structures are formed in the semiconductor substrate such that various active regions are determined accordingly. In the example of FIG. 3 for illustration, an active region 202 is defined in the semiconductor substrate and surrounded by an isolation feature 203. The active region 202 has a length L3 as illustrated in FIG. 3.

One or more operational devices 204, such as devices 1, 2, . . . and n, are formed in the active region 202. The operational devices 204 are field-effect transistors (FETs). In one example, the FETs are metal-oxide-semiconductor transistors (MOSFETs). Each MOSFET includes a source and drain regions formed in the semiconductor substrate, a gate stack formed on the semiconductor substrate and horizontally interposed between the source and drain regions. A channel defined in the substrate and configured between the source and drain, and underlying the gate stack. The channel is strained to enable the carrier mobility of the device and enhance the device performance. Particularly, the source and drain regions are formed by an epitaxy process with a semiconductor different from silicon to achieve the strained channel. In one embodiment, the silicon germanium (SiGe) is deposited by an epitaxy process on the silicon substrate to form the source and drain regions. In furtherance of the embodiment, the FETs are p-type MOSFETs. The source and drain regions of the PMOSFETs are made of epi SiGe. In another embodiment, the silicon carbide (SiC) is deposited by an epitaxy process on the silicon substrate to form the source and drain regions. In furtherance of the embodiment, the FETs are n-type MOSFETs. The source and drain regions of the NMOSFETs are made of epi SiC. In another embodiment, The FETs includes PMOS with source/drain regions of epi SiGe and NMOS with source/drain regions of epi SiC. In another embodiment, the gate stack includes a high k dielectric material layer disposed on the substrate, a metal layer disposed on the high k dielectric material layer. Additionally, an interfacial layer, such as silicon oxide, may be interposed between the high k dielectric material layer and the metal layer.

The operational devices 204 are configured as an array in the active region 202 as illustrated FIG. 3. The pitch of the device array is labeled as "P" in FIG. 3. In one side of the device array 204, one or more dummy gate stacks 206 are positioned in the same active region 202 and is aligned with the device array with the same pitch to the adjacent device of the device array 204. Similarly, in other side of the device array 204, one or more dummy gate stacks 206 are positioned in the same active region 202 and is aligned with the device array with the same pitch to the adjacent operational device of the device array 204. Thus the device array 204 within the active region 202 is enclosed by the dummy gate stacks 206. In another words, the device array 204 is sandwiched by the dummy gate stacks 206. The dummy gate stacks are substantially same to the gate stacks of the operational devices in terms of formation, composition and structure.

The disclosed structure addresses the issues noted above and enhances the device performance. It is noted that length "L3" of the active region in the disclosed semiconductor structure 200 is greater than "L1" of the structure 100 and "L2" of the structure 150 if other parameters are same. As the active region is further extended such that the dummy gate is also disposed in the active region instead of the isolation region, the STI related stress is reduced and the epi source/drain related stress is more uniform to the operational devices 204.

One example of the advantages associated with the disclosed structure is provided. Since the circuit design is aligned with the strained transistor engineering process according to the disclosed structure, the circuit design is improved for PMOS transistor with epi SiGe source/drain regions. Other advantages may present in various applications, such as minimizing layout degradation effects (LDE) in PMOS device; resolving non-symmetric SiGe S/D; reducing STI-edge leakage and improving device performance. Additionally, since the circuit design layout is designed according to the disclosed structure, there is no change to the fabrication process flow. Therefore, there is no additional masking cost and wafer manufacturing cost. It is understood that different embodiments disclosed herein offer different advantages and that no particular advantage is necessarily required for all embodiments.

Figure 4:
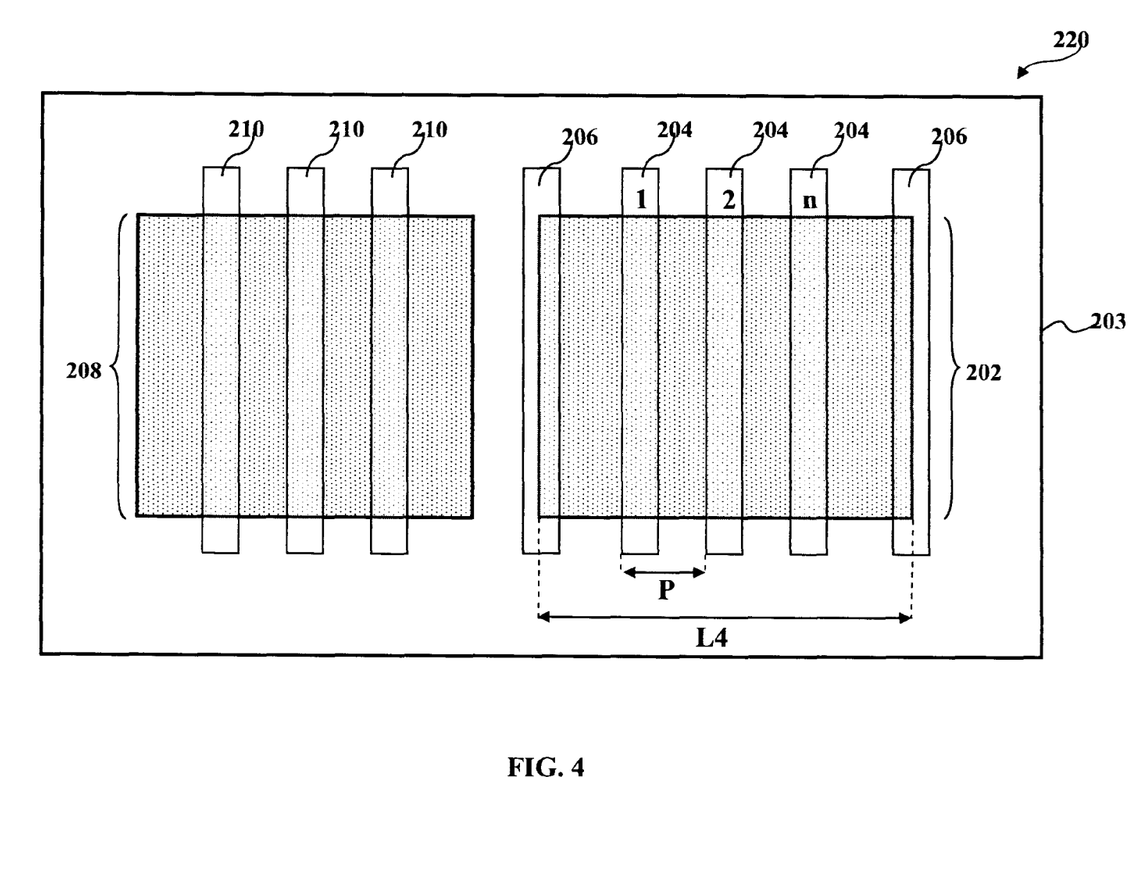
FIG. 4 is a top view of a semiconductor structure constructed according to aspects of the present disclosure in another embodiment.

FIG. 4 is a top view of a semiconductor structure (integrated circuit) 220 constructed according to aspects of the present disclosure in another embodiment. The semiconductor structure 220 is described below according to one or more embodiments. The semiconductor device 220 includes an active region 202 defined in a semiconductor substrate (not shown). The semiconductor substrate is a silicon substrate. Various shallow trench isolation structures are formed in the semiconductor substrate such that various active regions are determined accordingly. In the example of FIG. 4 for illustration, an active region 202 is defined in the semiconductor substrate and surrounded by the isolation feature 203, such as a STI. The active region 202 has a length L4 as illustrated in FIG. 4.

One or more operational devices 204, such as devices 1, 2, . . . and n, are formed in the active region 202. The operational devices 204 are FETs, similar to those illustrated in FIG. 3. Particularly, the channel is strained to enable the carrier mobility of the device and enhance the device performance. The source and drain regions are formed by an epitaxy process with a semiconductor different from silicon to achieve the strained channel. In one embodiment, the SiGe is deposited by an epitaxy process on the silicon substrate to form the source and drain regions. In furtherance of the embodiment, the FETs are p-type MOSFETs. The source and drain regions of the PMOSFETs are made of epi SiGe. In another embodiment, the SiC is deposited by an epitaxy process on the silicon substrate to form the source and drain regions. In furtherance of the embodiment, the FETs are n-type MOSFETs. The source and drain regions of the NMOSFETs are made of epi SiC. In another embodiment, The FETs includes PMOS with source/drain regions of epi SiGe and NMOS with source/drain regions of epi SiC. In another embodiment, the gate stack includes a high k dielectric material layer disposed on the substrate, a metal layer disposed on the high k dielectric material layer. Additionally, an interfacial layer, such as silicon oxide, may be interposed between the high k dielectric material layer and the metal layer.

The operational devices 204 are configured as an array in the active region 202 as illustrated FIG. 4. The pitch of the device array is labeled as "P" in FIG. 4. In one side of the device array 204, one or more dummy gate stacks 206 are positioned at least partially in the same active region 202 and is aligned with the device array 204 with the same pitch to the adjacent operational device of the device array 204. Similarly, in other side of the device array 204, one or more dummy gate stacks 206 are positioned at least partially in the same active region 202 and is aligned with the device array 202 with the same pitch to the adjacent operational device of the device array 204. Thus the device array 204 within the active region 202 is enclosed by the dummy gate stacks 206. The dummy gate stacks are substantially same to the gate stacks of the operational devices in terms of formation, composition and structure. In another embodiment, the dummy gates are positioned to be butted to the edge of the active region 202.

The semiconductor structure 220 further includes one or more dummy active regions 208 disposed adjacent to the active region 202. The active regions and dummy active regions each is separated from the others by the isolation feature 203, such as a shallow trench isolation structure. With the dummy active regions, the substrate stress can be tuned according to the designed strain effect to the substrate for enhanced mobility. The one or more dummy active regions 208 are disposed surrounding the active region 202 in a configuration such that the active regions (including both the dummy active regions and the operational active regions) have a substantial uniform density on the substrate. As another example, the proper configuration of the dummy active regions can improve the chemical mechanical polishing (CMP) processing effect when a CMP process is applied to the substrate during the formation of the STI structures. The dummy active regions 208 may have similar dimensions to those of the active region 202 in one example. The dummy active regions 208 may be disposed around the active region 202 with a proper distance in another example.

One or more additional dummy gates 210 are disposed on the dummy active regions 208 and may be additionally disposed on the STI. The dummy gates disposed on the dummy active regions 208 and on the STI are substantially similar to the dummy gates 204 on the active region 202 and similar to the operational gates of the devices 204 in terms of the formation, composition and dimension. The dummy gates 206 and 210 are configured with the operational devices 204 such that the gate density on the substrate are substantially uniform, therefore the boundary effect of the active region is minimized and the stress built in the substrate for the strained substrate is substantially maintained. The dummy gates 210 are aligned with the device array 204 with the same pitch to the adjacent operational device of the device array 204.

The disclosed semiconductor structure 220 addresses the issues noted above and enhances the device performance. It is noted that length "L4" of the active region in the disclosed semiconductor structure 220 is greater than "L1" of the structure 100 if other parameters are same and is greater than "L2" of the structure 150 if the dummy gates are at least partially on the active region. As the active region is further extended such that at least a portion of the dummy gates is also disposed in the active region 202, the STI related stress is reduced and the epi source/drain related stress is more uniform to the operational devices 204. Furthermore, the dummy active regions 208 and the dummy gates 210 disposed on the dummy active regions and on the STI are further configured on the semiconductor structure 220 to address the above issue and enhance the device performance.

Figure 5:
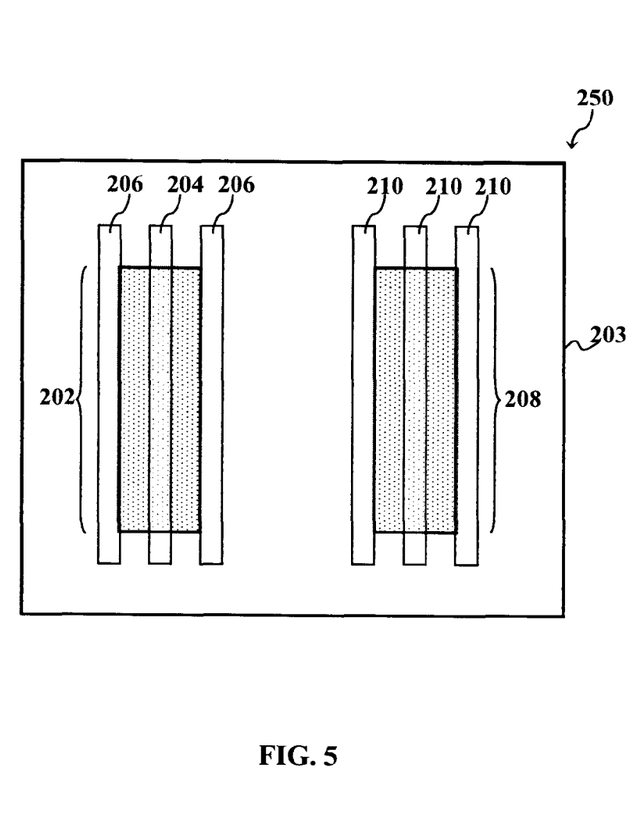
FIGS. 5 through 8 are top views of a semiconductor structure constructed according to aspects of the present disclosure in various embodiments.

As the furtherance of the semiconductor structure 220 of FIG. 4, various embodiments are further provided for illustration. FIGS. 5 through 8 are top views of a semiconductor structure constructed according to aspects of the present disclosure in various embodiments. FIG. 5 illustrates a semiconductor structure 250 having the active region 202, the dummy active region 208, the operational gates 204, and the dummy gates 206 and 210. In the semiconductor structure 250, the dummy gates 206 are positioned to be butted to the active region 202. The dummy active region 208 is aligned with the active region 202. The dummy active region 208 and the dummy gates 210 are configured in a way similar to the configuration of the active region 202, the dummy gates 206 and device 204. Therefore, the semiconductor structure 250 is referred to as a symmetric structure. In this example, only one device 204 is illustrated. One dummy gate 206 is disposed on each side of the device 204. However, the illustrated number of the device 204 and number of the dummy gates 206 are only examples and are not mean to be limiting.

Figure 6:
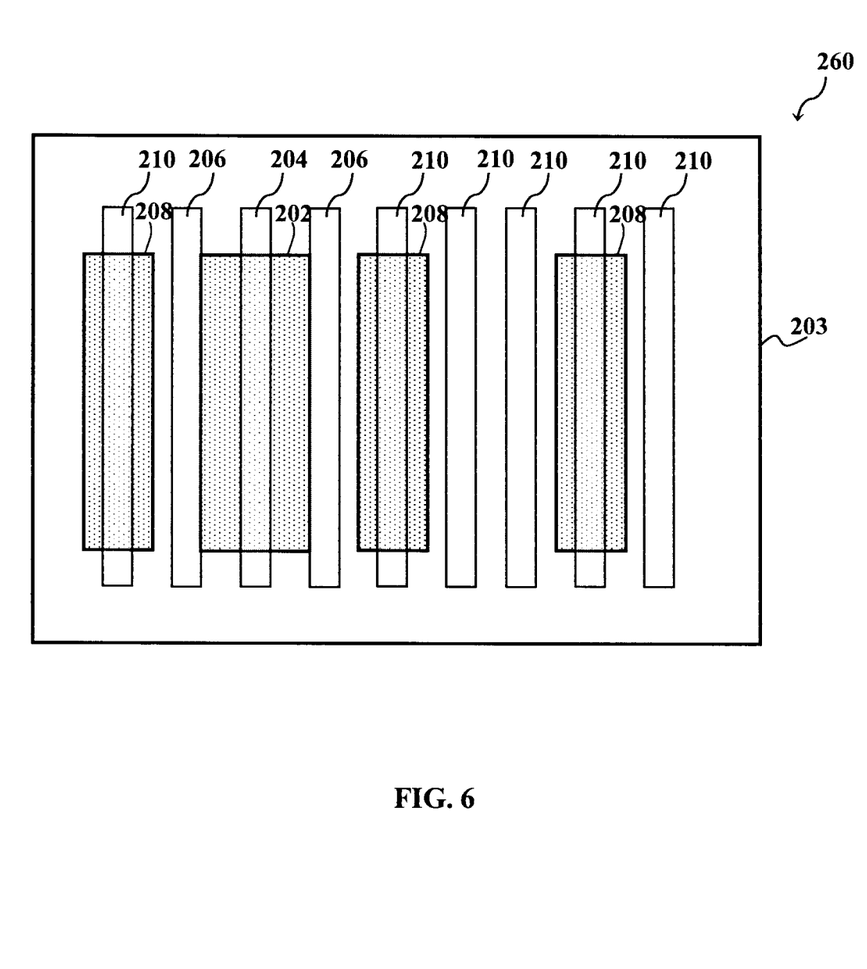

FIG. 6 illustrates a semiconductor structure 260 having the active region 202, the dummy active regions 208, the operational gates 204, and the dummy gates 206 and 210. In the semiconductor structure 260, the dummy gates 206 are positioned to be butted to the active region 202. More than one dummy active regions 208 are aligned with the active region 202 and each may have an individual dimension. Therefore, this semiconductor structure 260 is referred to as an asymmetric structure. In one example, the dummy active regions are deigned such that the pattern density of the active regions are substantially uniform. In another example, the dummy gates 210 are aligned with the dummy gates 206 and device 204 with a same pitch.

Figure 7:
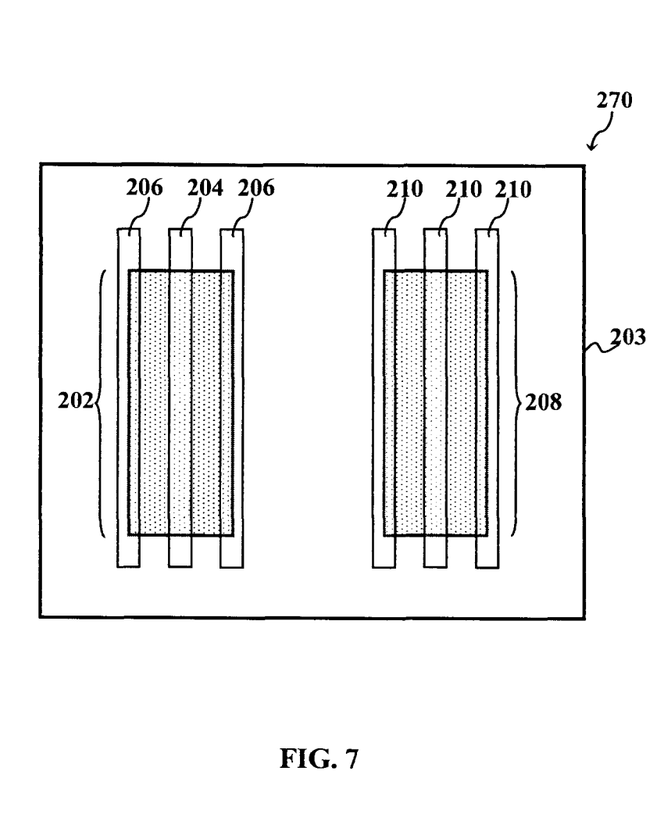

FIG. 7 illustrates a semiconductor structure 270 having the active region 202, the dummy active region 208, the operational gates 204, and the dummy gates 206 and 210. In the semiconductor structure 270, the dummy gates 206 are positioned partially on the active region 202. The dummy active region 208 is aligned with the active region 202. Similarly, the dummy gates 210 are positioned partially on the dummy active region 208. The dummy active region 208 is aligned with the active region 202. The dummy active region 208 and the dummy gates 210 are configured in a way similar to the configuration of the active region 202, the dummy gates 206 and device 204 such that all gates are aligned with a same pitch. Therefore, the semiconductor structure 270 is referred to as a symmetric structure.

Figure 8:
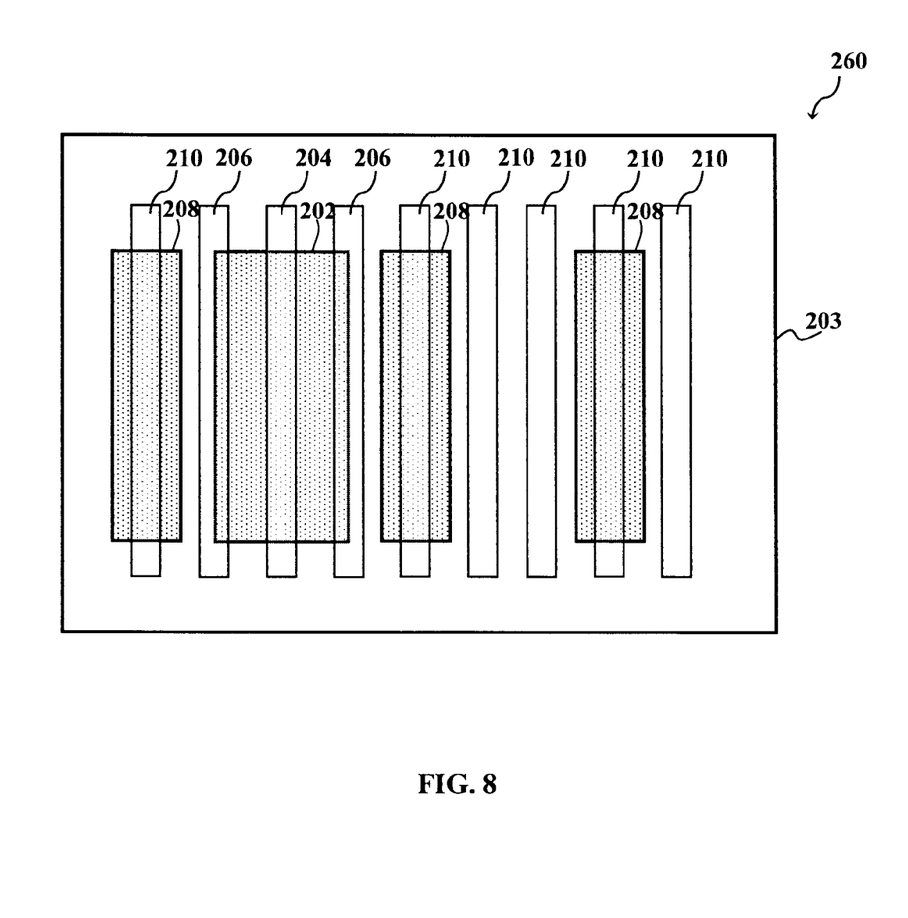

FIG. 8 illustrates a semiconductor structure 280 having the active region 202, the dummy active regions 208, the operational gates 204, and the dummy gates 206 and 210. In the semiconductor structure 280, the dummy gates 206 are positioned partially on the active region 202. More than one dummy active regions 208 are aligned with the active region 202 and each may have an individual dimension. Therefore, this semiconductor structure 280 is referred to as an asymmetric structure. In one example, the dummy active regions are designed such that the pattern density of the active regions are substantially uniform. In another example, the dummy gates 210 are aligned with the dummy gates 206 device 204 with a same pitch and are partially on the dummy active region. A portion of the dummy gates may be positioned on the STI to achieve an uniform pattern density of the gate array (including the operational gates and dummy gates).

Various examples of the advantages associated with the disclosed structure are provided. Since the circuit design is aligned with the strained transistor engineering process according to the disclosed structure, the circuit design is improved for PMOS transistor with epi SiGe source/drain regions. In another example with butted dummy gates (or dummy gates at least partially on the active region) and the dummy active regions, the facet shape is avoided and the channel stress is increased. Other advantages may present in various applications, such as minimizing layout degradation effects (LDE) in PMOS device; and reducing STI-edge leakage and improving device performance. Additionally, since only circuit design layout is designed according to the disclosed structure, there is no change to the fabrication process flow. Therefore, there is no additional masking cost and manufacturing cost.

Although embodiments of the present disclosure have been described in detail, those skilled in the art should understand that they may make various changes, substitutions and alterations herein without departing from the spirit and scope of the present disclosure. In one embodiment, various dummy gates are disposed in a seal ring area. Thus the gate layers are patterned not only in the circuit regions but also in the seal ring regions, achieving an uniform pattern density of the gate layers in both circuit regions and seal ring regions. The dummy gates in the seal ring regions can be formed in the same process to form the operational gates and other dummy gates. In one embodiment, the dummy gate density ranges between about 20% and about 40%. Various device features of the semiconductor structure 200/220 and the method to make the same are further described below according to more embodiments. In one example, the semiconductor substrate may alternatively includes other semiconductor material, such as diamond, silicon carbide or gallium arsenic.

In another embodiment, the semiconductor substrate may include an epitaxial layer. For example, the substrate may have an epitaxial layer overlying a bulk semiconductor. Furthermore, the substrate may include a semiconductor-on-insulator (SOI) structure such as a buried dielectric layer. Alternatively, the substrate may include a buried dielectric layer such as a buried oxide (BOX) layer, such as that formed by a method referred to as separation by implantation of oxygen (SIMOX) technology, wafer bonding, selective epitaxial growth (SEG), or other proper method.

The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The metal gate stacks for both operational devices and dummy gates are similar in terms of composition, dimension, formation and structure. These gate stacks can be formed in a single process. In one embodiment, a high k dielectric material layer is formed on the semiconductor substrate. A metal gate layer is formed on the high k dielectric material layer. A capping layer is further interposed between the high k dielectric material layer and the metal gate layer. The high k dielectric material layer is formed by a suitable process such as an atomic layer deposition (ALD). Other methods to form the high k dielectric material layer include metal organic chemical vapor deposition (MOCVD), physical vapor deposition (PVD), UV-Ozone Oxidation and molecular beam epitaxy (MBE). In one embodiment, the high k dielectric material includes HfO2. In another embodiment, the high k dielectric material includes Al2O3. Alternatively, the high k dielectric material layer includes metal nitrides, metal silicates or other metal oxides. The metal gate layer is formed by PVD or other suitable process. The metal gate layer includes titanium nitride. In another embodiment, the metal gate layer includes tantalum nitride, molybdenum nitride or titanium aluminum nitride. The capping layer is interposed between the high k dielectric material layer and the metal gate layer. The capping layer includes lanthanum oxide (LaO). The capping layer may alternatively includes other suitable material.

In another embodiment of the metal gate stack, an interfacial layer, such as silicon oxide, is formed on the substrate before the deposition of the high k dielectric material layer. The silicon oxide may be formed by a thermal oxidation or atomic layer deposition (ALD). The thin silicon oxide layer is formed on the silicon substrate. A high k dielectric material layer is formed on the silicon oxide layer by ALD or other suitable process. The high k dielectric material includes HfO2 or other suitable material. A capping layer is formed on the high k dielectric material layer. The capping layer includes lanthanum oxide or other suitable material. A metal gate layer is formed on the capping layer by PVD or other suitable method. The metal gate layer includes titanium nitride or other proper material as provided above. A polysilicon layer or a metal layer such as tungsten or aluminum is further formed on the metal gate layer by chemical vapor deposition (CVD), plating, physical vapor deposition (PVD) or other suitable method. Then the various metal gate stack layers are patterned to form both operational metal gate stacks and dummy gate stacks.

Then the various gate material layers are patterned to form gate stacks for both operational devices and the dummy gates. The method to pattern the gate material layers includes applying various dry and wet etching steps, using a patterned mask defining various openings. The gate layers within the openings of the patterned mask are removed by the one or etching processes. In one embodiment, the first dry etching process utilizes fluorine-containing plasma to remove the polysilicon or the metal gate layer. The patterned mask is formed on the multiple metal-gate-stack layers. In one example, the patterned mask is a patterned photoresist layer formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper methods such as maskless photolithography, electron-beam writing, ion-beam writing, and molecular imprint. In another embodiment, the patterned mask layer includes a patterned hard mask layer. In one example, the patterned hard mask layer includes silicon nitride. As one example of forming the patterned silicon nitride hard mask, a silicon nitride layer is deposited on the polysilicon layer by a low pressure chemical vapor deposition (LPCVD) process. The silicon nitride layer is further patterned using a photolithography process to form a patterned photoresist layer and an etching process to etch the silicon nitride within the openings of the patterned photoresist layer. Alternatively, other dielectric material may be used as the patterned hard mask. For example, silicon oxynitride may be used as the hard mask.

Then one or two types epi semiconductor materials can be grew after the formation of the gate stacks, by a selective epi growth (SEG). The epi semiconductor layer is self-aligned with source and drain regions. In one example, SiGe is epi grew in the source and drain regions of the PMOS transistors. In another example, the SiC us epi grew in the source and drain regions of the NMOS transistors. The epi formed source and drain features on the silicon substrate is able to induce the stress to the associated channel and therefore to tune the carrier mobility thereof to enhance the device performance.

One or more ion implantation steps are further performed to form various doped regions, such as doped sources and drains, and/or light doped drain (LDD) features. In one example, the LDD regions are formed after the formation of the gate stack and/or the epi source and drain region, and therefore aligned with the gate stacks. A gate spacer may be formed on the sidewalls of the metal gate stack. Then heavy source and drain doping processes are performed to form heavy doped sources and drains, and therefore the heavy doped sources and drains are substantially aligned with the outer edges of the spacers. The gate spacers may have a multilayer structure and may include silicon oxide, silicon nitride, silicon oxynitride, or other dielectric material. The doped source and drain regions and LDD regions of either an n-type dopant or a p-type dopant are formed by a conventional doping process such as ion implantation. N-type dopant impurities employed to form the associated doped regions may include phosphorus, arsenic, and/or other materials. P-type dopant impurities may include boron, indium, and/or other materials. silicide are formed on the raised source and drain features to reduce the contact resistance. Then silicide can be formed on the sources and drains by a process including depositing a metal layer, annealing the metal layer such that the metal layer is able to react with silicon to form silicide, and then removing the non-reacted metal layer.

Then an inter-level dielectric (ILD) layer is formed on the substrate and a chemical mechanical polishing (CMP) process is further applied to the substrate to polish the substrate. In another example, an etch stop layer (ESL) is formed on top of the gate stacks before forming the ILD layer. In one embodiment, the gate stacks formed above are final metal gate structure and remain in the final circuit. In another embodiment, the thus formed gate stacks are partially removed and then refilled with proper materials for various fabrication consideration such as thermal budget. In this case, the CMP process is continued until the polysilicon surface is exposed. In another embodiment, the CMP process is stopped on the hard mask layer and then the hard mask is removed by a wet etching process.

A multilayer interconnection (MLI) is formed on the substrate to electrically connect various device features to form a functional circuit. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

The semiconductor structure 200 serves only as one example. The semiconductor structure 200 may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

Although embodiments of the present disclosure have been described in detail, those skilled in the art should understand that they may make various changes, substitutions and alterations herein without departing from the spirit and scope of the present disclosure. In one embodiment, the disclosed structure is applicable to a p-type metal-oxide-semiconductor field-effect-transistor (PMOSFET). In another embodiment, strained channel and metal gate stack are combined with the disclosed structure with operational device array and dummy gate in the same active regions in the way such that the device performance are consistent and uniform for those operational devices in the same active region. In another embodiment, the NMOS transistors, PPMOS transistors and dummy gate stacks are configured in the same active regions to form complementary MOS transistors with optimized device performance.

Thus, the present disclosure provides an integrated circuit. The integrated circuit includes an active region in a semiconductor substrate; at least one operational device on the active region, wherein the operational device include a strained channel; and a first dummy gate disposed at a side of the operational device and on the active region.

The integrated circuit may further include a dummy active region in the semiconductor substrate and adjacent the active region; a shallow trench isolation (STI) in the semiconductor substrate and interposed between the active region and the dummy active region; and a second dummy gate disposed on the dummy active region. The integrated circuit may further include a third dummy gate disposed at another side of the operational device and on the STI. The first dummy gate may be partially positioned on the active region.

In the disclosed integrated circuit, wherein the first dummy gate is partially positioned on the active region. In one embodiment, the first dummy gate is partially positioned on the active region. The integrated circuit may further include a third dummy gate disposed at another side of the operational device and on STI. The operational device may include an epi silicon germanium (SiGe). source/drain feature. In this case, the operational device is a p-type metal-oxide-semiconductor field-effect transistor (PMOSFET). In another embodiment, the operational device may include an n-type MOSFET (NMOSFET) having a silicon source/drain feature; and a PMOSFET having an epi SiGe source/drain feature. In another embodiment, the operational device may include an NMOSFET having an epi silicon carbide (SiC) source/drain feature; and a PMOSFET having an epi SiGe source/drain feature. In another embodiment, the operational device may include an NMOSFET having an epi silicon carbide (SiC) source/drain feature; and a PMOSFET having a silicon source/drain feature. The operational device may further include a metal gate stack having a high k dielectric material layer and a metal layer disposed on the high k dielectric material layer. The dummy gate may include a second metal gate stack having the high k dielectric material layer and the metal layer disposed on the high k dielectric material layer. In one embodiment, the integrated circuit may further includes a seal ring region in a semiconductor substrate; and a second dummy gate disposed on the seal ring region.

The present disclosure also provides another embodiment of an integrated circuit. The circuit includes a silicon substrate having an active region and a dummy active region; a shallow trench isolation interposed between the active region and the dummy active region; a plurality of n-type metal-oxide-semiconductor (NMOS) transistors and a plurality of PMOS transistors on the active region, wherein the NMOS transistors include a first type source and drain regions made by a first semiconductor material and the PMOS transistors include a second type source and drain region made by a second semiconductor material different from the first semiconductor material; a first and a second dummy gates disposed on the STI and enclosing the NMOS and PMOS transistors; and a third dummy gate disposed on the dummy active region.

In the disclosed integrated circuit, one of the first and second dummy gate may be butted to an edge of the active region. In another embodiment, one of the first and second dummy gate may be partially on the active region. The first type source and drain regions may include silicon and the second type source and drain regions include silicon germanium (SiGe). In another embodiment, the first type source and drain regions include silicon carbide (SiC) and the second type source and drain regions include silicon germanium (SiGe). In another embodiment, the first type source and drain regions include silicon carbide (SiC) and the second type source and drain regions include silicon. In another embodiment, the second type source and drain regions are formed by an epitaxy process.

The present disclosure also provides another embodiment of an integrated circuit. The circuit includes a silicon substrate having an active region and a dummy active region; a shallow trench isolation (STI) formed in the semiconductor substrate, surrounding the active region and interposed between the active region and the dummy active region; a plurality of field-effect transistors (FETs) on the active region, wherein each of the FETs includes a metal gate stack; source and drain regions made disposed on the sides of the metal gate stack and by an epi semiconductor material different from silicon; and a strained channel underlying the metal gate stack. The circuit further includes a first dummy metal gate stack disposed on the active region and at a first side of the FET transistors; a second dummy metal gate stack disposed on the active region and at a second side of the FET transistors, such that the first and second dummy gates enclosing the FETs; and a third dummy gate disposed on the dummy active region.

In one embodiment of the disclosed integrated circuit, the FETs are p-type metal-oxide-semiconductor FETs (PMOS-FETs) and the epi semiconductor material includes silicon germanium (SiGe). In another embodiment, the FETs are n-type metal-oxide-semiconductor FETs (NMOSFETs) and the epi semiconductor material includes silicon carbide (SiC). The metal gate stack may include a high k dielectric material layer and a metal layer disposed on the high k dielectric material layer. The metal gate stack may further include a capping layer interposed between the high k dielectric material layer and the metal layer. One of the first and second dummy metal gate stacks may be positioned partially on the STI.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
    an active region in a semiconductor substrate;
    at least one operational device on the active region, wherein the operational device includes a strained channel;
    a first dummy gate disposed at a side of the operational device and directly on the active region;
    a dummy active region in the semiconductor substrate and adjacent the active region;
    a shallow trench isolation (STI) interposed between the active region and the dummy active region; and
    a second dummy gate disposed on the dummy active region.

2. The integrated circuit of claim 1, further comprising a third dummy gate disposed on the STI.

3. The integrated circuit of claim 1, wherein the first dummy gate is partially positioned on the active region.

4. The integrated circuit of claim 1, wherein the second dummy gate is disposed at another side of the operational device.

5. The integrated circuit of claim 1, wherein the operational device comprises an epi silicon germanium (SiGe) source/drain feature.

6. The integrated circuit of claim 5, wherein the operational device is a p-type metal-oxide-semiconductor field-effect transistor (PMOSFET).

7. The integrated circuit of claim 1, wherein the operational device comprises:
    an n-type MOSFET (NMOSFET) having a silicon source/drain feature; and
    a PMOSFET having an epi SiGe source/drain feature.

8. The integrated circuit of claim 1, wherein the operational device comprises:
    an NMOSFET having an epi silicon carbide (SiC) source/drain feature; and
    a PMOSFET having an epi SiGe source/drain feature.

9. The integrated circuit of claim 1, wherein the operational device comprises:
    an NMOSFET having an epi silicon carbide (SiC) source/drain feature; and
    a PMOSFET having a silicon source/drain feature.

10. The integrated circuit of claim 1, wherein the operational device includes a high-k/metal gate stack.

11. The integrated circuit of claim 1, further comprising:
    a seal ring region in a semiconductor substrate; and
    wherein the second dummy gate is disposed on the seal ring region.

12. The integrated circuit of claim 1, wherein the first dummy gate stack is positioned butted to the active region.

13. An integrated circuit, comprising:
    a silicon substrate having an active region and a dummy active region;
    a shallow trench isolation surrounding the active region and interposed between the active region and the dummy active region;
    a plurality of n-type metal-oxide-semiconductor (NMOS) transistors and a plurality of PMOS transistors on the active region, wherein the NMOS transistors include first type source and drain regions made by a first semiconductor material and the PMOS transistors include second type source and drain regions made by a second semiconductor material different from the first semiconductor material;
    first and second dummy gates disposed on the STI such that the NMOS transistors and the PMOS transistors are located in between the first and second dummy gates, wherein one of the first and second dummy gates is directly on the active region; and
    a third dummy gate disposed on the dummy active region.

14. The integrated circuit of claim 13, wherein the first dummy gate is butted to an edge of the active region.

15. The integrated circuit of claim 13, wherein the first dummy gate is partially on the active region.

16. The integrated circuit of claim 13, wherein the first type source and drain regions include silicon carbide (SiC).

17. The integrated circuit of claim 13, wherein the second type source and drain regions include silicon germanium (SiGe).

18. An integrated circuit, comprising:
    a semiconductor substrate having an active region and a dummy active region;
    a shallow trench isolation (STI) formed in the semiconductor substrate, surrounding the active region and interposed between the active region and the dummy active region;
    a plurality of field-effect transistors (FETs) on the active region, wherein each of the
    FETs includes:
        a metal gate stack;
        a source region and a drain region interposed by the metal gate stack, wherein both the source region and the drain region include an epi semiconductor material; and
        a strained channel underlying the metal gate stack;
    a first dummy metal gate stack disposed directly on the active region and at a first side of the FETs;
    a second dummy metal gate stack disposed directly on the active region and at a second side of the FETs, such that the first dummy metal gate stack and the second dummy metal gate stack enclose the FETs; and
    a third dummy metal gate stack disposed on the dummy active region.

19. The integrated circuit of claim 18, wherein first dummy metal gate stack and the second dummy metal gate stack are each butted to the active region.

20. The integrated circuit of claim 18, wherein the wherein first dummy metal gate stack and the second dummy metal gate stack are each positioned partially on the active region.

* * * * *